United States Patent [19]
O'Toole

[11] Patent Number: 5,751,647
[45] Date of Patent: *May 12, 1998

[54] ON-CHIP MEMORY REDUNDANCY CIRCUITRY FOR PROGRAMMABLE NON-VOLATILE MEMORIES, AND METHODS FOR PROGRAMMING SAME

[75] Inventor: James E. O'Toole, Boise, Id.

[73] Assignee: Micron Technology, Inc., Boise, Id.

[*] Notice: The term of this patent shall not extend beyond the expiration date of Pat. No. 5,513,144.

[21] Appl. No.: 802,376

[22] Filed: Feb. 19, 1997

Related U.S. Application Data

[63] Continuation of Ser. No. 596,528, Feb. 5, 1996, Pat. No. 5,648,934, which is a continuation of Ser. No. 387,244, Feb. 13, 1995, Pat. No. 5,513,144.

[51] Int. Cl.$^6$ ................................................. G11C 7/00
[52] U.S. Cl. ............... 365/200; 365/185.09; 365/189.05; 365/230.08; 365/236
[58] Field of Search .................... 365/200, 233.5, 365/201, 236, 230.08, 189.05, 185.09

[56] References Cited

U.S. PATENT DOCUMENTS

| | | | |
|---|---|---|---|
| 5,097,447 | 3/1992 | Ogawa et al. | 365/236 X |
| 5,289,413 | 2/1994 | Tsuchida et al. | 365/230.02 X |
| 5,418,754 | 5/1995 | Sakakibara | 365/201 X |
| 5,422,851 | 6/1995 | Ozeki | 365/201 X |
| 5,428,569 | 6/1995 | Kato et al. | 365/185.09 X |
| 5,513,144 | 4/1996 | O'Toole | 365/189.05 X |
| 5,648,934 | 7/1997 | O'Toole | 365/185.09 X |

OTHER PUBLICATIONS

Vancu, Radu et al. "Nonvolatile and Fast Static Memories", 1990 IEEE Intl. Solid State Cir. Conf. pp. 64–65.

*Primary Examiner*—Do Hyun Yoo
*Attorney, Agent, or Firm*—Wells, St. John, Roberts, Gregory & Matkin, P.S.

[57] ABSTRACT

A programmable non-volatile memory device includes a memory array of addressable memory cells and multiple redundant memory cells for replacing defective memory cells in the memory array. To program the memory device, data is written to one or more of the addressable memory cells in the memory array. In the event that the data is not validly written into the address memory cells, repeated attempts are made to program the same memory cells. The memory device includes a counter for counting the number of times the same memory cells are accessed for programming purposes. When a predetermined number of such programming cycles is achieved, the address memory cells are determined to be defective. A redundancy address matching circuit is enabled at this point to replace the defective memory cells with redundant memory cells that can be validly programmed. The memory device subsequently routes the data to the redundant memory cells instead of the defective memory cells. A system including a programming machine and the programmable non-volatile memory device, and methods for programming such memory devices, are also disclosed.

21 Claims, 4 Drawing Sheets

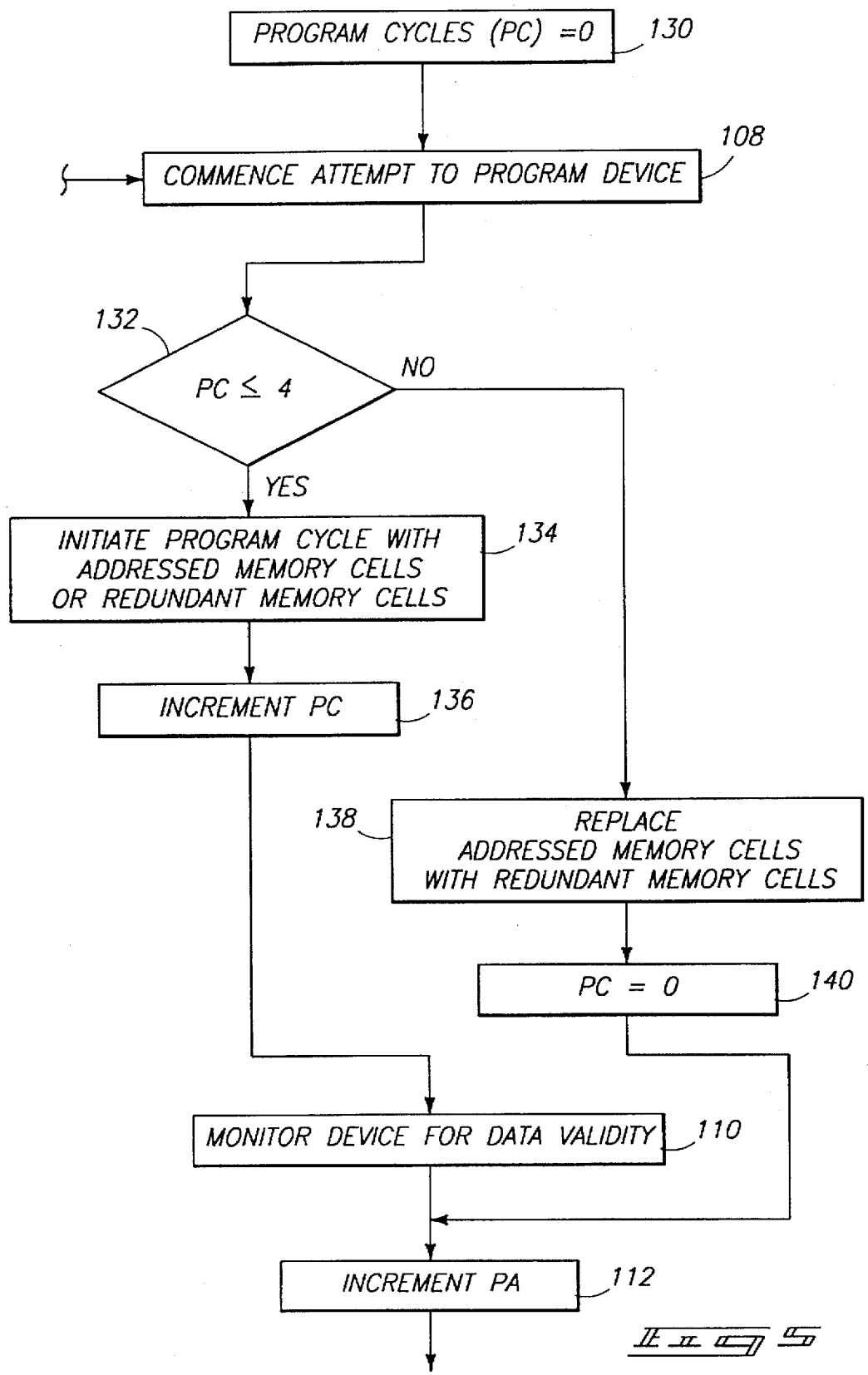

ON-CHIP MEMORY REDUNDANCY CIRCUITRY FOR PROGRAMMABLE NON-VOLATILE MEMORIES, AND METHODS FOR PROGRAMMING SAME

CROSS REFERENCE TO RELATED APPLICATION

This application is a continuation application of U.S. patent application Ser. No. 08/596,528, filed Feb. 5, 1996, entitled "On-Chip Memory Redundancy Circuitry for Programmable Non-Volatile Memories, and Methods for Programming Same", now U.S. Pat. No. 5,648,934 which in turn is a continuation of U.S. patent application Ser. No. 08/387,244, filed Feb. 13, 1995 now U.S. Pat. No. 5,513,144.

TECHNICAL FIELD

This invention relates to programmable, non-volatile memories and methods for programming them.

BACKGROUND OF THE INVENTION

There is a continuing goal in the semiconductor memory technologies to improve the manufacturing yield of integrated circuit (IC) memory devices. "Yield" is often expressed as the number of operable IC memory devices that are suitable for marketing as a percentage of the total number of IC memory devices produced during any given manufacturing batch. Traditionally, individual IC memory devices were considered defective if any portion of the chip did not function properly. This unfortunately lead to the rejection of some IC chips even though only a few memory cells of the entire array proved inoperable.

To improve yield, semiconductor memory manufacturers began designing memory chips with additional redundant memory cells. When defective memory cells were detected during the manufacturing process, redundant memory cells were wired to replace the flawed or defective cells prior to packaging. By replacing the inoperable memory cells with operable redundant memory cells, an otherwise defective memory device could be upgraded to an operable device suitable for sale. Accordingly, the use of redundant cells improved the manufacturing yield.

Another prior art solution to handling defective memory cells was to simply avoid the bad cells through the use of special operating systems that were implemented in software or firmware external to the memory device. One object of this invention is to provide an on-chip solution to defective memory bytes.

Programmable non-volatile memories are a type of memory device that can be programmed by placing an electric charge in the individual memory cells of the device. The electric charge is representative of binary data, where commonly a +5 volt charge represents a binary data "1" and minimal or no charge represents a binary data "0". Non-volatile memories retain this charge even when power is removed from the device.

Programmable non-volatile memories can be generally classified in the following groups: programmable read-only memories (PROMs), electrically programmable read-only memories (EPROMs), and electrically erasable programmable read-only memories (EEPROMs). A PROM is considered to be a one-time programmable (OTP) device where data can be written to the memory cells only once. In contrast, EPROMs and EEPROMs are typically considered a multi-time programmable (MTP) device because data can be written to the memory cells, then erased, and then rewritten to many different times.

To program such memories, a high programming voltage (e.g., 12.75 volts) is applied to the memory array to drive the desired electric charge into selected memory cells. After the cells have been programmed, the high programming voltage is removed, and the charges are maintained in the cells for an indefinite period of time.

Ideally, all memory cells in the programmable non-volatile memory can be programmed and retain the charge for a long period of time. In practice, however, less than all memory cells prove effective at receiving and holding a charge. The percentage of operable cells that are validly programmable to the total number of cells is referred to as "programming yield". There is a continuing need in the manufacture of programmable non-volatile memories to improve programming yield.

Programming yield is typically tested at the factory prior to shipment. For MTP programmable memories, the cells can be programmed, tested, and then erased prior to shipment. It is more difficult for OTP programmable memories which cannot be fully tested at the factory because individual cells cannot be programmed, tested and then erased prior to shipment. Accordingly, OTP programmable memories often have a lower programming yield than MTP memories. There is a need to improve the programming yield of OTP memories.

Another aspect unrelated to programming yield is the ability to write, erase, and rewrite data many times to MTP memories (such as EPROMs and EEPROMs). The number of times a memory performs this function is known as "endurance". Memory chips are said to have longer endurance the more times data can be written to them, erased, and then rewritten to the same memory cells. There is a continuing need in the industry to extend the endurance of rewritable, non-volatile memories.

One prior art solution to improving endurance is through the use of error correction circuitry (ECC). This system uses complex algorithms and circuitry to insure that correct data is being written into, and read from, the memory cells. The use of such circuitry has the drawback in that it requires substantial chip space.

This invention provides a programmable non-volatile memory device which improves programming yield (for both MTP and OTP memories) and endurance. The novel memory device also has on-chip circuitry to identify and replace defective memory bytes.

BRIEF DESCRIPTION OF THE DRAWINGS

Preferred embodiments of the invention are described below with reference to the accompanying drawings, which are briefly described below.

FIG. 5 is a flow diagram of the steps taken by the FIG. 4 memory device during programming. FIG. 5 also shows the interrelationship between the FIG. 3 programming sequence conducted external to the memory device and the internal memory steps occurring each programming cycle.

DETAILED DESCRIPTION OF THE PREFERRED EMBODIMENTS

Figure 1:
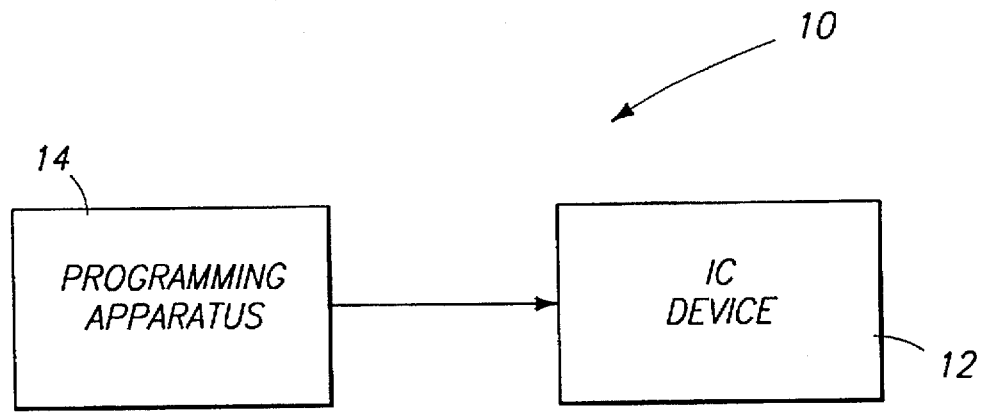
FIG. 1 is a diagrammatic block diagram illustrating one embodiment of this invention where a programmable non-volatile memory device is programmed by an external programming apparatus.

This disclosure of the invention is submitted in furtherance of the constitutional purposes of the U.S. Patent Laws "to promote the progress of science and useful arts" (Article 1, Section 8).

According to one aspect of this invention, a programmable non-volatile memory device comprises:
- a memory array of addressable memory cells to store electronic data in the memory cells;
- multiple redundant memory cells to replace defective memory cells in the memory array;
- programming means for (1) addressing one or more memory cells within the memory array at a selected address, (2) writing data to the addressed memory cells, and (3) re-writing the data to the addressed memory cells in the event that the data is not validly written into the addressed memory cells;
- a counter to count a number of attempts the programming means makes to write the data to the addressed memory cells and for generating a redundancy enable signal when the number of attempts reaches a predetermined number; and
- redundant memory replacement means for replacing the addressed memory cells with the redundant memory cells upon receipt of the redundancy enable signal.

According to another aspect of the invention, a system for testing a programmable non-volatile memory device to identify and disable defective memory cells comprises:
- a programmable non-volatile integrated circuit memory device having a memory array of addressable memory cells for storing electronic data and multiple redundant memory cells for replacing defective memory cells in the memory array;
- a programming device for programming the programmable non-volatile memory device and for subsequently monitoring the memory device to determine whether it has been validly programmed; the programming device operating according to an algorithm for programming individual memory cells in the memory device where in the event that the memory cells are not validly programmed, the programming device continues to program the same memory cells for a predetermined number of programming attempts in an effort to validly program the memory cells;
- the programmable non-volatile memory device further comprising:
  - an address buffer coupled to the memory array for holding a selected address to one or more memory cells in the memory array;
  - a data buffer coupled to the memory array for holding data to be input into the memory cells at the selected address;
  - a controller for initiating an internal programming cycle to program the memory array in response to the programming attempts made by the programming device, one internal programming cycle including accessing the memory array at the selected address held in the address buffer and writing the data held in the data buffer into the memory cells at the selected address;
  - the controller, in the event that the data is not validly written into the addressed memory cells, repeatedly initiating the programming cycle for the same addressed memory cells in response to the continued programming attempts made by the programming device;
  - a counter for counting a number of internal programming cycles that the controller initiates to the same address, the counter outputting a redundancy enable signal when the number of programming cycles reaches a predetermined number indicating that the addressed memory cells are defective, the predetermined number of internal programming cycles being less than or equal to the predetermined number of programming attempts;
  - a redundancy address matching circuit operatively coupled to the counter and the address buffer for managing the replacement of defective memory cells in the memory array with redundant memory cells, the redundancy address matching circuit assigning replacement redundant memory cells for the defective memory cells upon receipt of the redundancy enable signal from the counter; and
  - the memory device subsequently routing the data to the redundant memory cells instead of the defective memory cells.

According to another aspect of this invention, a method for programming a non-volatile memory device comprises the following steps:
- providing a memory array of addressable memory cells;
- providing multiple redundant memory cells for replacing defective memory cells in the memory array;
- addressing one or more memory cells within the memory array according to a selected address;
- writing data to the addressed memory cells;
- detecting whether the data is validly written into the addressed memory cells;
- in the event that the data is not validly written into the addressed memory cells, re-writing the data to the same addressed memory cells in an attempt to validly write the data into the same addressed memory cells within the memory array;
- counting a number of attempts to write the data to the same addressed memory cells; and
- replacing the addressed memory cells with the redundant memory cells when the number of write attempts counted by the counter reaches a predetermined number.

These and other aspects of the invention are described in more detail with reference to the Figures.

FIG. 1 illustrates a system 10 for testing a programmable non-volatile memory device to identify and disable defective memory cells therein. System 10 comprises a programmable non-volatile integrated circuit (IC) memory device 12 coupled to a programming device 14. Preferably, the programming device is a separate programming machine or apparatus used to program integrated circuit memory devices. Such programming apparatuses are common and typically owned by purchasers of the memory devices so that they can program the devices according to their particular needs.

Programming apparatus 14 has an operating mode where data is written to every cell in the programmable IC device to place the desired data pattern in the memory array of the IC device. In this mode, the programming apparatus attempts to program one or more memory cells in the memory device by sending data in the form of different charge levels to the addressed memory cells. The programming apparatus then monitors the memory device to determine whether those cells have been validly programmed and are maintaining the charge placed in the cells.

If the devices are not validly programmed, the programming apparatus repeatedly attempts to program the same memory cells for a given number of attempts, such as twenty-five attempts. If the memory cells fail to be properly programmed following the twenty-fifth attempt, the programming apparatus declares those cells defective and declares the device defective. Such programming apparatuses are available on the market and will not be described in detail. The algorithms used by the programming apparatus to program the memory devices are also well known. An example algorithm is the Quick-Pulse Programming™ algorithm provided by Intel.

Figure 3:
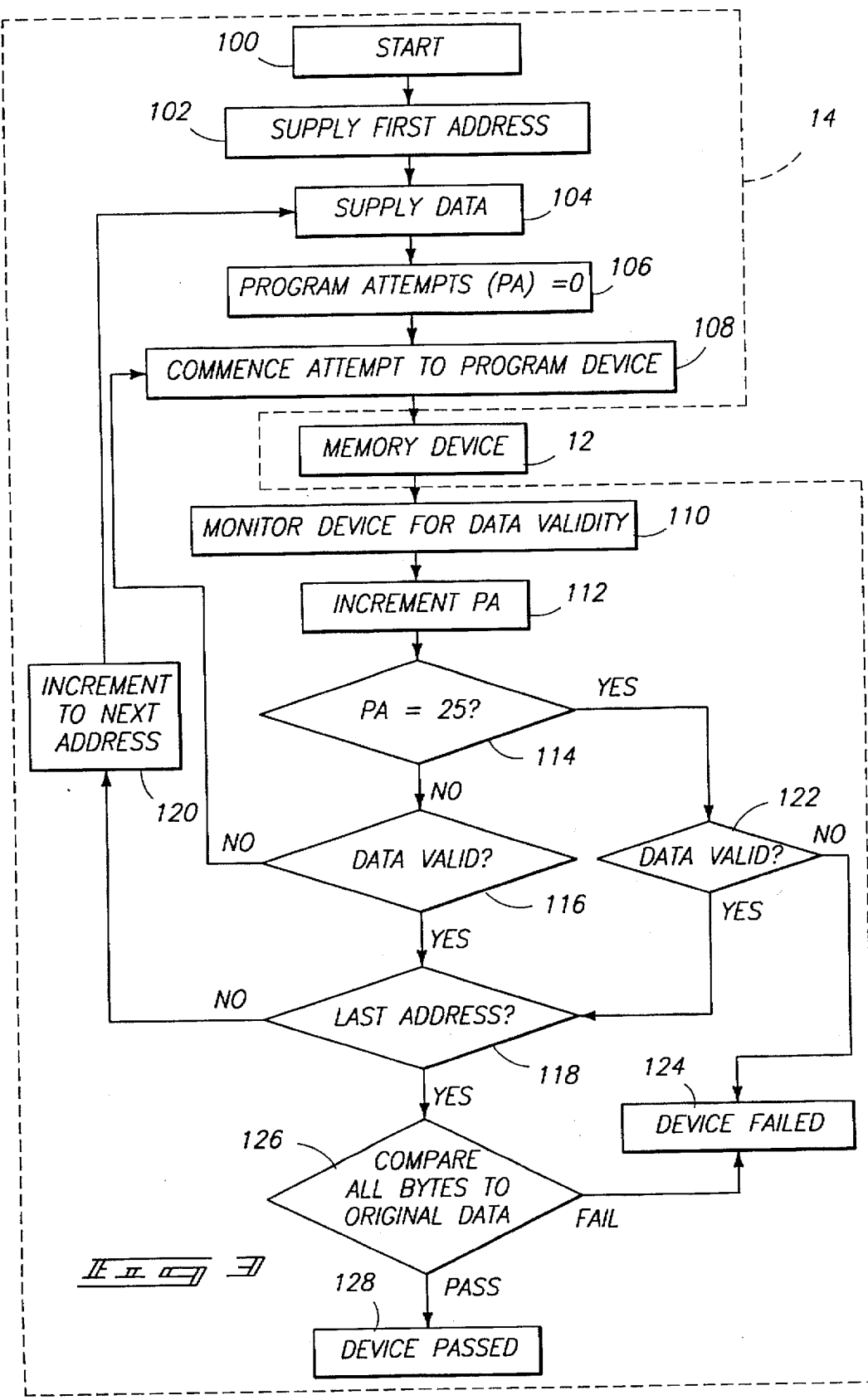
FIG. 3 is a flow diagram illustrating the steps conducted external to the memory device for initiating a programming sequence to program the memory device.

FIG. 3 illustrates an example technique for programming IC memory device 12 based upon the Quick-Pulse Programming™ algorithm. The dashed line around most of the flow diagram, but excluding memory device 12, illustrates the operational steps performed by the programming apparatus 14. The programming steps shown in FIG. 3 attempt to program each individual memory cell in memory device 12, and then check it to determine whether it has been validly programmed.

Upon initiation of the program (step 100), a first address of one or more memory cells within the memory array is supplied to the address inputs of the memory device (step 102). Typically, an entire byte consisting of eight or sixteen memory cells is addressed simultaneously. The data to be programmed into the memory device is also provided at the data I/Os (step 104). Next, the number of programming attempts (PA) is initialized to zero (step 106) and the programming apparatus commences the first attempt to program IC memory device 12 (step 108). The selected address, data, and control signals are forwarded to IC memory device 12 to initiate one programming cycle within the memory device where the selected memory cells are accessed and written to according to the supplied address and data.

After this programming attempt, programming apparatus 14 monitors IC memory device 12 to determine whether the data was validly written into the addressed memory cells (step 110). The programming attempt (PA) counter is incremented at step 112. At step 114, the programming apparatus determines whether the number of attempts to that same address has reached a predetermined number of programming attempts, such as twenty-five. If the number of attempts to program the same cells is less than twenty-five, the algorithm determines whether the cells have been written with valid data (step 116). If the data is valid, the programming apparatus 14 will provide the next address (steps 118 and 120) and commence a new programming attempt at a new address. On the other hand, if the data is not valid at step 116, the programming apparatus will attempt once again to program that same byte using the same address. In fact, the programming apparatus will continue to reprogram the same memory cells twenty-five times. If after the twenty-fifth attempt the memory cells are not properly programmed, the device is deemed to have failed (steps 122 and 124).

Programming apparatus 14 continues through the entire IC memory device 12 until all of the addressed memory cells have been programmed and monitored to determine whether the cells are operable or defective. Upon reaching the last address, all bytes are once again compared to the original data (step 126), and if the comparison proves successful, the device is passed (step 128).

It should be noted that other algorithms for programming IC memory devices are also available, and can be used in the context of this invention.

Figure 2:
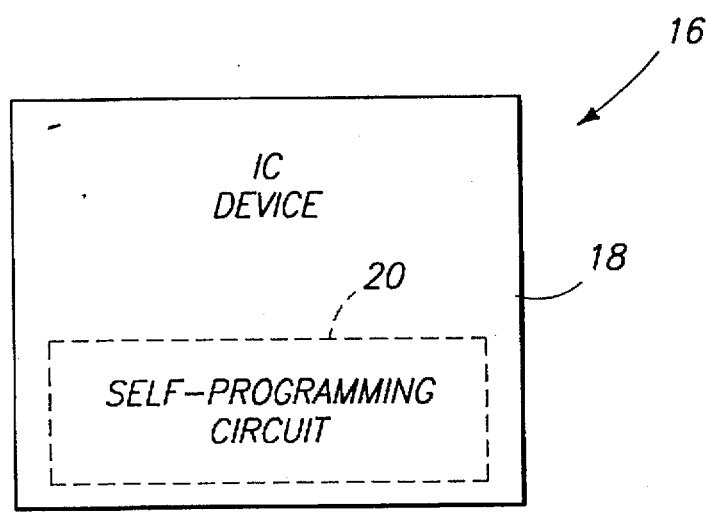
FIG. 2 is a diagrammatic block diagram illustrating another embodiment of this invention where a self-programming circuit is incorporated on the programmable non-volatile memory chip.

FIG. 2 shows an alternative embodiment of a system 16 for testing a programmable non-volatile memory device to identify and disable defective memory cells. System 16 consists of an IC memory device 18 having a self-programming circuit 20 formed on the same chip as the memory device. Self-programming circuit 20 contains similar algorithms for conducting the tests of each memory cell as that discussed above. The FIG. 2 embodiment is less preferred because circuit 20 consumes chip space that could otherwise be used for other circuitry or additional memory.

As the embodiment of FIG. 1 is most preferred, the continuing discussion with FIGS. 4–5 will be described in the context of an IC memory device 12 operably coupled to a programming machine 14.

Figure 4:
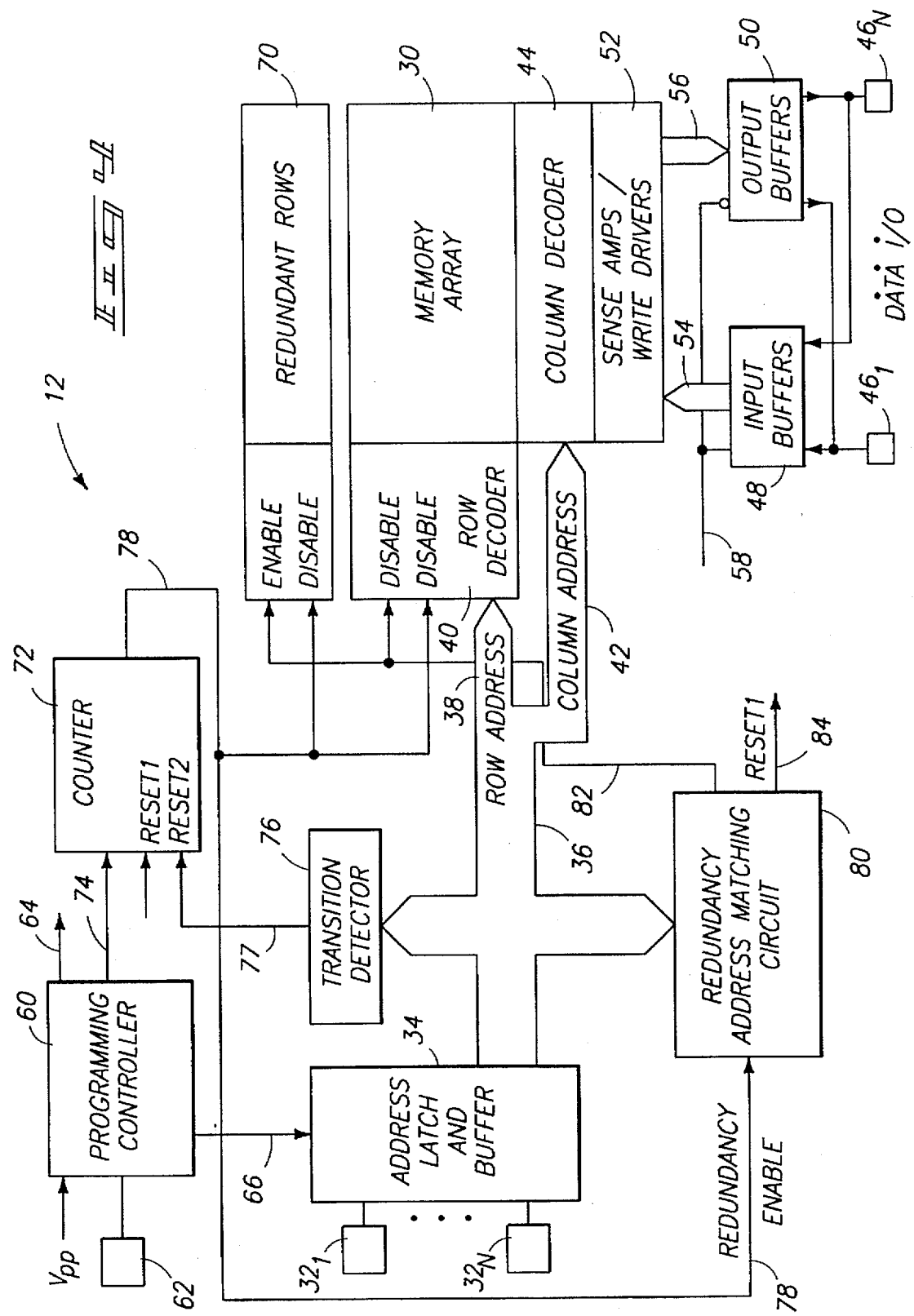
FIG. 4 is a detailed block diagram of a programmable non-volatile memory device according to this invention.

FIG. 4 shows programmable non-volatile integrated circuit memory device 12 in more detail. Memory device 12 has a memory array 30 of addressable memory cells arranged in rows and columns. Individual memory cells store electronic data in the form of electric charges, where conventionally a +5 volt charge represents a binary "1", and a minimal or zero volt charge represents a binary "0". An address to a memory array location is input at address inputs $32_1, \ldots, 32_N$ and held in address latch and buffer 34. Address buffer 34 latches the address therein to free the external bus (not shown) for other information handling tasks without changing or affecting the address loaded into memory device 12.

Address buffer 34 is coupled to memory array 30 via address bus 36. The address transferred over bus 36 is separated into its row and column components, where the row address is carried on row bus portion 38 and input into row decoder 40, and the column address is carried on column bus portion 42 and input into column decoder 44. Row decoder 40 and column decoder 44 decipher the address to locate the specific location in memory array 30 of the one or more memory cells being accessed. Typically, an entire byte or word is accessed simultaneously with one address. For example, in a 16M anti-fuse PROM, sixteen memory cells defines a 16-bit byte or word.

The data to be input into the accessed memory array is input at data I/Os $46_1, \ldots, 46_N$. The data I/Os are also used during the read operation when data is retrieved from memory array 30. Data I/Os $46_1, \ldots, 46_N$ are connected to input buffers 48 and output buffers 50. The input and output buffers are coupled to memory array 30 via respective buses 54 and 56, sense amplifiers/write drivers 52, and column decoder 44. An I/O select signal carried by conductor 58 selectively enables input buffer 48 or output buffer 50 to move data into or out from the memory array as desired.

Memory device 12 further includes a programming controller 60 for initiating a programming cycle of memory array 30. Programming controller 60 initiates the programming cycle in response to an external chip-enable signal ($\overline{CE}$) at input 62. During programming, the chip enable signal is provided by programming apparatus 14 (FIG. 1). Each programming cycle includes accessing the memory array 30 at the selected address held in address buffer 34 and writing data held in input data buffers 48 into the memory cells at the selected address. The operation of accessing a memory cell using row decoder 40 and column decoder 44 is conventional and well understood in the art.

Programming controller 60 also receives a programming voltage $V_{pp}$ from programming machine 14 during testing. The memory cells in programmable non-volatile devices (such as PROMs, EPROMs, and EEPROMs) typically employ floating gate technology where charges are placed on the floating gate by applying a high voltage to the cell that is effective to drive an electric charge onto the gate. Controller 60 outputs a high voltage control signal 64 during the programming cycle to program the selected memory cells in memory array 30 according to the data provided at data I/Os $46_1, \ldots 46_N$. Controller 60 also outputs a latch signal 66 to latch the selected address in buffer 34.

According to this circuit configuration, programming controller 60, address buffer 34, input buffers 48, busing 36, 38, 42, 54, and 56, row decoder 40, column decoder 44, sense amplifiers 52, and memory array 30 define a memory array programming means responsive to an external programming machine. The programming means performs the following tasks: (1) addressing one or more memory cells within memory array 30 at a selected address held in buffer 34, (2) writing data held in buffers 48 to address memory cells, and (3) rewriting the same data to the same addressed memory cells in the event that the data is not validly written in the previous attempt.

IC memory device 12 also includes multiple redundant memory cells 70 for replacing defective memory cells 30. Preferably, the redundant memory cells are arranged in rows to conveniently replace an entire defective byte or word row in memory array 30. In a 16M anti-fuse PROM embodying this invention, an extra 48 rows of redundant memory cells 70 are provided for the memory array.

According to this invention, the memory device 12 is designed to replace defective bytes in memory array 30 with redundant rows 70. The redundancy replacement occurs automatically before the programming apparatus 14 declares the IC chip defective. To administer this replacement, memory device 12 has additional circuitry which keeps track of the number of attempts the programming apparatus 14 has made to program the memory array. In the event that the memory cells are not validly programmed within a certain number of attempts, the memory device 12 has a redundant memory replacement means for automatically replacing the defective addressed memory cells in array 30 with operable redundant cells from redundancy array 70. This replacement is done entirely internal to the chip and occurs before the programming apparatus has reached the maximum number of programming attempts (e.g., twenty-five attempts). The redundancy replacement is not detected or known to programming apparatus 14 and the user. The use of redundancy in this context improves both programming yield and endurance, as will become more apparent through the continuing discussion.

More particularly with reference to FIG. 4, IC memory device 12 has a counter 72 coupled to receive a programming mode signal 74 from controller 60. Counter 72 counts the number of internal programming cycles that the controller initiates to the same address held in buffer 34. Counter 72 is preferably an up-counter which incrementally counts from an initial value, such as 0, to a predetermined value. A transition detector 76 is operatively coupled to address buffer 34 through address bus 36 to detect a change in address held in the buffer. A change of address indicates that the memory cells at the previous address were validly programmed. When an address change occurs, transistor detector 76 resets counter 72 via reset signal 77 to the counter's initialized value.

Conversely, if the counter reaches the predetermined number of programming cycles without an address change, it is an indication that the addressed memory cells in the memory array are not being validly programmed. The memory device therefore self-declares these memory cells to be defective. As used herein, the term "defective" means that the memory cells, for whatever reason, are not properly receiving, holding, and outputting the desired charge representative of the data being stored therein. Upon reaching the predetermined number of programming cycles, counter 72 outputs a redundancy enable signal 78 which is fed into a redundancy address matching circuit 80.

Redundancy address matching circuit 80 manages the replacement of defective memory cells in the memory array with redundant memory cells 70. The redundancy address matching circuit stores addresses of the defective memory cells, and assigns a replacement row of redundant memory cells for the defective byte upon receipt of the redundancy enable signal 78 from counter 72. Following this assignment and replacement, redundancy address matching circuit 30 outputs a reset signal 84 to reset counter 72.

Thereafter, when subsequent addresses are loaded into buffer 34, the addresses are compared in matching circuit 80 with the stored addresses that have already been identified as being associated with defective bytes in memory array 30. When a match occurs, the memory device will substitute the previously assigned redundant cells for the defective cells. Matching circuit 80 outputs a match signal 82 which disables memory array 30 and the defective byte therein, and enables the assigned row of redundant memory cells 70. Memory device 12 thereby subsequently routes the data to the redundant memory cells instead of the defective memory cells in the memory array whenever the address of defective cells is received in buffer 34.

It should be noted that redundancy enable signal 78 output by counter 72 is also used to disable memory array 30 and redundant rows 70. In this manner, no cells are accessed during the programming cycle in which the memory device is preparing to replace the defective byte with a redundant row. In other words, one programming cycle is used to replace the defective memory cells with redundant ones. The array disabling precaution insures that no erroneous data is input to any cells during the replacement transition.

The operation of IC memory device 12 in FIG. 4 will now be described in more detail with reference to FIG. 5. FIG. 5 illustrates the relationship between the operational steps that occur external to the memory device, such as in programming apparatus 14 (FIG. 1), and the operational steps occurring internal to the memory device. The flow diagram illustrated in FIG. 5 thus shows some identical steps (with the same reference numerals) as discussed above with reference to FIG. 3.

At the start of the programming process, the program cycle (PC) counter within counter 72 on IC memory device 12 is initialized to zero at step 130. The programming apparatus 14 then attempts to program IC device 12 using the data and address contained in the buffers on the memory device. The programming apparatus 14 sends the chip enable signal ($\overline{CE}$) to memory device input 62 which instructs program controller 60 to initiate a programming cycle within the chip.

As noted above, in the preferred embodiment, the programming apparatus will attempt to program the same memory cells approximately twenty-five times. IC memory device 12 preferably replaces defective memory cells with redundant memory cells before the programming apparatus reaches the twenty-fifth programming attempt. In this manner, a chip which might otherwise be identified by programming apparatus 14 as inoperable or defective might now be classified as operable through use of the internally substitutable redundant memory. Accordingly, internal programming counter 72 has an upper count limit that is less than twenty-five, and most preferably the predetermined number of programming cycles is five or less. In the flow chart shown in FIG. 5, an example upper limit of four is used.

Accordingly, after the programming apparatus commences an attempt to program the IC device, it is first determined whether the number of internal programming cycles (PC) within counter 72 has reached the upper predetermined number of four (step 132). If the number of programming cycles is less than or equal to four, the memory device initiates an internal programming cycle by accessing the memory cells at the address contained in buffer 34 and loading the data contained in input buffers 48 into the memory cells (step 134). Counter 72 then increments the program cycle (PC) count at step 136.

The programming apparatus 14 monitors the memory device to determine whether data was validly written into the addressed memory cells (step 110). As discussed above, if the address is not validly written, the programming apparatus will commence another attempt to program the same cells. This will continue so along as the memory cells are not properly programmed for up to twenty-five attempts.

When the number of programming cycles exceeds four, counter 72 outputs redundancy enable signal 78 to initiate the process of replacing the defective memory cells with redundant memory cells (step 138). Notice that there is no internal programming cycle that is initiated during this process as this cycle is used to replace the defective memory cells with redundant memory cells. After this replacement takes place, counter 72 is reset via signal 84 so that the number of programming cycles (PC) is re-initialized to zero (step 140).

According to another aspect of this invention, the redundant memory cells 70 are correlated with the address of the defective memory cells within redundancy address matching circuit 80. This can be done by using fuses or other elements similar to those used in the memory cells. After the defective memory cells have been replaced by redundant cells and the addresses have been correlated within the redundancy address matching circuit, the memory device will subsequently program, write data to, or read from the associated redundant cells anytime the address of the defective cells appears in buffer 34. In this manner, redundancy address matching circuit 80 provides a redundant memory replacement means for (1) storing the selected address of the memory cells that have been replaced by the redundant memory cells, (2) comparing subsequent addresses to the memory array with the stored addresses, and (3) substituting the replacement redundant memory cells when a match occurs so that the data will be routed to the redundant memory cells rather than to the defective memory cells.

The programmable non-volatile memory device of this invention is advantageous over prior art memory devices in that it internally keeps count of the number of programming attempts being made by the external programming apparatus. When a number of such attempts reaches a certain level less than the total number of attempts that the programming machine is expected to make, the memory device itself declares the memory cells defective and replaces them with redundant memory cells. In this manner, redundant memory cells are substituted before the programming apparatus ever reaches its upper limit (i.e., twenty-five attempts) to thereby increase the programming yield of the memory device. That is, the programming device will assume that the redundant memory cells are simply the originally addressed memory cells that have become operable on the sixth or subsequent attempt. The programming device will therefore proceed to the next address rather than declare the entire memory device as failed.

In the event that the redundant cells prove inoperable, the memory device can also replace defective redundant memory cells with a new set of redundant memory cells. Theoretically, with the number of programming attempts set to twenty-five and the predetermined number of programming cycles set to four (plus one additional cycle to effectuate redundancy replacement), the memory device can substitute four different redundant rows of memory cells before the programming device reaches its upper limit and declares the device inoperable.

This invention also has the added benefit in that memory cells which become defective well into the life of the memory device can be replaced at a later time by the redundant memory cells. As a result, the invention improves the endurance of such memory devices because the redundant cells facilitate more write-erase-rewrite operations throughout the memory life without permanent failure.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A programmable non-volatile memory device comprising:

a memory array of memory cells;

a controller programming one of the memory cells with data, the controller repeatedly attempting to program the one memory cell in the event that the data is not validly written into the one memory cell;

a redundant memory cell;

a counter counting the number of attempts the controller makes to program the one memory cell;

means for generating a redundancy enable signal when the number of attempts counted by the counter reaches a predetermined value; and means for replacing the one memory cell with the redundant memory cell in response to the redundancy enable signal.

2. A programmable non-volatile memory device in accordance with claim 1 and further comprising an address buffer coupled to the memory array and holding an address to select at least one of the memory cells of the array, and wherein the replacing means comprises a redundancy address matching circuit coupled to the counter and the address buffer and managing substitution of the replaced memory cell with the redundant memory cell.

3. A programmable non-volatile memory device comprising:

a memory array of memory cells;

a controller programming one of the memory cells with data, the controller repeatedly attempting to program the one memory cell in the event that the data is not validly written into the one memory cell;

a redundant memory cell;

a counter counting the number of attempts the controller makes to program the one memory cell;

circuitry generating a redundancy enable signal when the number of attempts counted by the counter reaches a predetermined value; and circuitry replacing the one memory cell with the redundant memory cell in response to the redundancy enable signal.

4. A programmable non-volatile memory device in accordance with claim 3 and further comprising an address buffer coupled to the memory array and holding an address to select at least one of the memory cells of the array, and wherein the replacing circuitry comprises a redundancy address matching circuit coupled to the counter and the address buffer and managing substitution of the replaced memory cell with the redundant memory cell.

5. An integrated circuit comprising:

a programmable non-volatile integrated circuit memory device having a memory array of addressable memory cells, having multiple redundant memory cells which can be selected to replace defective memory cells in the memory array, and having an address buffer coupled to the memory array, the address buffer holding an address to select a memory cell in the memory array;

a programming device programming the non-volatile memory device such that, in the event that one of the memory cells addressed by the address buffer is not validly programmed, the programming device continues to program that memory cell for a predetermined number of programming attempts in an effort to validly program that memory cell;

a counter for counting a number of internal programming cycles that the programming device initiates to the same address, the counter outputting a redundancy enable signal when the number of internal programming cycles reaches a predetermined number, the predetermined number of internal programming cycles being less than or equal to the predetermined number of programming attempts; and a redundancy address matching circuit operatively coupled to the counter and the address buffer for managing the replacement of the defective memory cells in the memory array with the redundant memory cells by directing data to the redundant memory cells instead of to the defective memory cells.

6. An integrated circuit in accordance with claim 5 wherein the predetermined number of internal programming cycles is less than the predetermined number of programming attempts.

7. An integrated circuit in accordance with claim 5 wherein the predetermined number of internal programming cycles is five or less and the predetermined number of programming attempts is twenty-five or less.

8. An integrated circuit in accordance with claim 5 wherein the redundancy address matching circuit resets the counter upon assigning one of the redundant memory cells for a memory cell for which the redundancy enable signal was generated.

9. An integrated circuit comprising:

a programmable non-volatile memory device having a memory array of addressable memory cells and multiple redundant memory cells;

a programming device for programming the programmable non-volatile memory device and for subsequently monitoring the memory device to determine whether the memory device has been validly programmed; the programming device programming individual memory cells in the memory device such that in the event that the memory cells are not validly programmed, the programming device continues to attempt to program the same memory cells for a predetermined, non-variable number of programming attempts in an effort to validly program the memory cells;

the programmable non-volatile memory device further comprising:

an address buffer coupled to the memory array to hold a selected address to one or more memory cells in the memory array;

a data buffer coupled to the memory array to hold data to be input into the memory cells at the selected address;

a controller configured to initiate an internal programming cycle to program the memory array in response to the programming attempts made by the programming device, the internal programming cycle including accessing the memory array at the selected address held in the address buffer and writing the data held in the data buffer into the memory cells at the selected address, the controller, in the event that the data is not validly written into the addressed memory cells, repeatedly initiating the programming cycle for the same addressed memory cells in response to the continued programming attempts made by the programming device;

a counter configured to count a number of internal programming cycles that the controller initiates to the same address, the counter outputting a redundancy enable signal when the number of programming cycles reaches a non-variable predetermined number indicating that the addressed memory cells are defective, the predetermined number of internal programming cycles being less than or equal to the predetermined number of programming attempts; and a redundancy address matching circuit operatively coupled to the counter and the address buffer for managing the replacement of the defective memory cells in the memory array with the redundant memory cells, the redundancy address matching circuit assigning the redundant memory cells for the defective memory cells upon receipt of the redundancy enable signal from the counter, the redundancy address matching circuit storing the addresses of the defective memory cells and comparing subsequent addresses held in the address buffer with the stored addresses and substituting the redundant memory cells when a match occurs, whereby the memory device subsequently routes the data to the redundant memory cells instead of to the defective memory cells.

10. An integrated circuit in accordance with claim 9 wherein the predetermined number of internal programming cycles is less than the predetermined number of programming attempts.

11. An integrated circuit in accordance with claim 9 wherein the predetermined number of internal programming cycles is less than six, and the predetermined number of programming attempts is less than twenty-six.

12. An integrated circuit in accordance with claim 9 wherein the redundancy address matching circuit resets the counter upon replacing the redundant memory cells for the defective memory cells.

13. A system comprising:

a programmable non-volatile memory device having a memory array of addressable memory cells for storing electronic data and multiple redundant memory cells for replacing defective memory cells in the memory array; and a programming device for programming the programmable non-volatile memory device and for subsequently monitoring the memory device to determine whether the memory device has been validly programmed, the programming device operating according to an algorithm for programming individual memory cells in the memory device where in the event that the memory cells are not validly programmed, the programming device continues to program the same memory cells for a predetermined number of programming attempts in an effort to validly program the memory cells;

the programmable non-volatile memory device further comprising:

an address buffer coupled to the memory array for holding a selected address to one or more memory cells in the memory array;

a data buffer coupled to the memory array for holding data to be input into the memory cells at the selected address;

a controller for initiating an internal programming cycle to program the memory array in response to the programming attempts made by the programming device, the internal programming cycle including accessing the memory array at the selected address held in the address buffer and writing the data held in the data buffer into the memory cells at the selected address;

the controller, in the event that the data is not validly written into the addressed memory cells, repeatedly initiating the programming cycle for the same addressed memory cells in response to the continued programming attempts made by the programming device;

a counter for counting a number of internal programming cycles that the controller initiates to the same address, the counter outputting a redundancy enable signal when the number of programming cycles reaches a predetermined number indicating that the addressed memory cells are defective, the predetermined number of internal programming cycles being less than or equal to the predetermined number of programming attempts;

a redundancy address matching circuit operatively coupled to the counter and the address buffer for managing the replacement of the defective memory cells in the memory array with the redundant memory cells, the redundancy address matching circuit assigning the redundant memory cells for the defective memory cells in response to receipt of the redundancy enable signal from the counter wherein the redundancy address matching circuit stores the addresses of the defective memory cells and compares subsequent addresses held in the address buffer with the stored addresses and substitutes the redundant memory cells when a match occurs; and the memory device subsequently routing the data to the redundant memory cells instead of to the defective memory cells.

14. A method for programming a non-volatile memory device comprising:

providing a memory array of addressable memory cells;

providing a redundant memory cell for replacing a defective memory cell in the memory array;

addressing a memory cell within the memory array according to a selected address;

writing data to the addressed memory cell;

detecting whether the data is validly written into the addressed memory cell;

in the event that the data is not validly written into the addressed memory cell, re-writing the data to the same addressed memory cell in an attempt to validly write the data into the same addressed memory cell within the memory array;

counting a number of attempts to write the data to the same addressed memory cell; and replacing the addressed memory cell with the redundant memory cell when the number of attempts reaches a fixed number.

15. A method according to claim 14 and further comprising storing the selected address of the addressed memory cell that is replaced by the redundant memory cell.

16. A method according to claim 14 and further comprising:

storing the selected address of the addressed memory cell that is replaced by the redundant memory cell;

comparing a subsequent address with the stored address; and substituting the redundant memory cell when a match occurs so that the data will be routed to the redundant memory cell rather than to the defective memory cell.

17. A method for programming a non-volatile integrated circuit memory device comprising:

providing the non-volatile integrated circuit memory device having a memory array of addressable memory cells for storing electronic data, a byte of redundant memory cells for replacing a byte of defective memory cells in the memory array, a data input, and an address input;

supplying an address of a byte of memory cells within the memory array to the address input;

supplying data to the data input;

commencing an attempt to program the memory device using the supplied data and address;

initiating a programming cycle within the memory device in response to the program attempt by accessing the byte of memory cells using the address at the address input and writing the data from the data input into the byte of memory cells at the address;

monitoring the memory device to determine whether the data was validly written into the byte of memory cells;

in the event the data is not validly written into the byte of memory cells, continuing to attempt to program the memory device using the same supplied address and data for a predetermined number of programming attempts in an effort to validly program the memory device, each programming attempt causing initiation of a programming cycle within the memory device;

counting the number of programming cycles made within the memory device;

replacing the addressed byte of memory cells with the byte of redundant memory cells when the number of programming cycles reaches a predetermined number indicating that the addressed byte of memory cells is defective;

correlating within the memory device an address of the byte of redundant memory cells with the address of the byte of defective memory cells at the address input; and after said replacing and correlating, initiating a programming cycle within the memory device in response to a subsequent program attempt by writing the data from the data input into the byte of redundant memory cells correlated to the address of the byte of defective memory cells at the address input.

18. A method according to claim 17 wherein the replacing occurs when the number of programming cycles reaches a number less than the predetermined number of programming attempts.

19. A method according to claim 17 wherein the replacing occurs when the predetermined number of programming cycles is being five or less and the predetermined number of programming attempts is twenty-five or less.

20. A method according to claim 17 wherein the correlating comprises storing the address of the defective byte of memory cells within the memory device.

21. A method according to claim 1 and further comprising:

supplying a new address of a byte of memory cells within the memory array to the address input;

and using the new address to:

initiate a programming cycle within the memory device in response to the program attempt by accessing the byte of memory cells using the new address at the address input and writing the data from the data input into the byte of memory cells at the new address;

monitor the memory device to determine whether the data was validly written into the byte of memory cells at the new address;

in the event the data is not validly written into the byte of memory cells at the new address, continue to attempt to program the memory device using the same supplied new address and the data for a predetermined number of programming attempts in an effort to validly program the memory device, each programming attempt causing initiation of a programming cycle within the memory device;

count the number of programming cycles made within the memory device;

replace the byte of memory cells at the new address with the byte of redundant memory cells when the number of programming cycles reaches a predetermined number indicating that the byte of memory cells at the new address is defective; and correlate within the memory device an address of the byte of redundant memory cells with the new address of the byte of defective memory cells at the address input.

\* \* \* \* \*

UNITED STATES PATENT AND TRADEMARK OFFICE
CERTIFICATE OF CORRECTION

PATENT NO. : 5,751,647
DATED : May 12, 1998
INVENTOR(S) : James E. O'Toole

It is certified that error appears in the above-identified patent and that said Letters Patent is hereby corrected as shown below:

Column 7, Line 11, replace "$46_1,... 46_N$" with --$46_1,..., 46_N$--.

Column 8, Line 18, replace "30" with --80--.

Column 15, Line 18, replace "claim 1" with --claim 17--.

Signed and Sealed this

First Day of September, 1998

BRUCE LEHMAN

*Attest:*

*Attesting Officer*      Commissioner of Patents and Trademarks